(12) United States Patent
Yu et al.

(10) Patent No.: US 9,695,321 B2
(45) Date of Patent: Jul. 4, 2017

(54) REFLECTIVE COMPOSITION

(71) Applicant: PHILIPS LIGHTING HOLDING B.V., Eindhoven (NL)

(72) Inventors: Jianghong Yu, Best (NL); Marius Gabriel Ivan, Ottawa (CA)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 0 days.

(21) Appl. No.: 14/895,653

(22) PCT Filed: May 23, 2014

(86) PCT No.: PCT/EP2014/060618
§ 371 (c)(1),
(2) Date: Dec. 3, 2015

(87) PCT Pub. No.: WO2014/195148
PCT Pub. Date: Dec. 11, 2014

(65) Prior Publication Data
US 2016/0122553 A1    May 5, 2016

(30) Foreign Application Priority Data
Jun. 6, 2013   (EP) ..................................... 13170758

(51) Int. Cl.
*C08K 3/38*       (2006.01)
*F21K 99/00*      (2016.01)
*B01J 19/12*      (2006.01)
*C09D 5/33*       (2006.01)
*C09D 183/04*     (2006.01)
(Continued)

(52) U.S. Cl.
CPC ............ *C09D 5/004* (2013.01); *B01J 19/123* (2013.01); *B05D 1/005* (2013.01); *C08K 3/22* (2013.01); *C08K 3/38* (2013.01); *C08L 83/04* (2013.01); *C09D 183/04* (2013.01); *C09D 183/06* (2013.01); *F21K 9/62* (2016.08); *H01L 33/60* (2013.01); *B01J 2219/1203* (2013.01); *C08K 2003/221* (2013.01);
(Continued)

(58) Field of Classification Search
None
See application file for complete search history.

(56) References Cited

U.S. PATENT DOCUMENTS

2007/0205706 A1   9/2007  Yamada et al.
2010/0055464 A1*  3/2010  Sung ................. B01J 21/18
                                          428/408

(Continued)

FOREIGN PATENT DOCUMENTS

EP       2584015 A1      4/2013
JP    2010248484 A      11/2010
(Continued)

*Primary Examiner* — Kishor Mayekar

(57) ABSTRACT

The present invention relates to a UV light reflective composition comprising a light transmissive matrix comprising a silicone resin, and UV light reflective particles comprising boron nitride, the particles being dispersed in the transmissive matrix. The light reflective particles of the UV light reflective composition has an average particle size within the range of from 0.2 to 0.7 μm. An advantage of the present invention is that it provides a highly light reflective composition, especially in the UV range.

20 Claims, 4 Drawing Sheets

(51) Int. Cl.
 *C08L 83/04* (2006.01)
 *H01L 33/60* (2010.01)
 *C08K 3/22* (2006.01)
 *B05D 1/00* (2006.01)
 *C09D 183/06* (2006.01)
 *F21K 9/62* (2016.01)

(52) U.S. Cl.
 CPC .............. *C08K 2003/2227* (2013.01); *C08K 2003/382* (2013.01); *C08K 2003/385* (2013.01)

(56) References Cited

U.S. PATENT DOCUMENTS

| | | | |
|---|---|---|---|
| 2010/0209294 A1* | 8/2010 | Owen | A61L 9/205 422/24 |
| 2012/0037939 A1* | 2/2012 | Urano | H01L 33/486 257/98 |
| 2012/0231058 A1 | 9/2012 | Yi et al. | |
| 2012/0244202 A1 | 9/2012 | Simonnet et al. | |
| 2013/0011617 A1* | 1/2013 | Tasaki | B29C 45/14 428/148 |
| 2013/0015478 A1* | 1/2013 | Oh | F21S 48/1154 257/98 |

FOREIGN PATENT DOCUMENTS

| | | |
|---|---|---|
| JP | 2012069794 A | 4/2012 |
| WO | 2012039434 A1 | 3/2012 |

\* cited by examiner

US 9,695,321 B2

REFLECTIVE COMPOSITION

FIELD OF THE INVENTION

The invention relates to a reflective composition as well as a UV light emitting arrangement and a photo reactor comprising the composition. The invention further relates to a method of manufacturing the UV light emitting arrangement.

BACKGROUND OF THE INVENTION

Ultraviolet (UV) light has been used for about a century for disinfection of objects and drinking water. UV light of the appropriate wavelength breaks down organic and inorganic chemicals as well as destroys the DNA of microorganisms such as bacteria, fungi and viruses. Using UV light for disinfection is advantageous since it is environmentally friendly, does not require addition of chemicals for disinfection such as in the case of chlorination, and it may be used in small/portable devices at point of use as well as large scale water treatment plants.

Since UV radiation, in particular UV-C (also referred to as "deep UV", or DUV) radiation can be harmful to humans, it is important to shield and/or isolate a UV light source to protect a user from being irradiated. One route to avoid such unwanted exposure is to use a reflective material for the purpose of isolating the UV light source or for e.g. directing UV-light towards a predetermined direction. It has been proposed to disperse a reflective particle into a matrix, which is highly light transmissive, to create the light reflective material. Aluminum is a commonly used reflective particle within the matrix. Aluminum reflects UV-light to about 85%.

JP2010248484 proposes a UV reflective composition comprising a silicon resin matrix and an inorganic filler containing fine powder of alumina or boron nitride dispersed in the silicon resin matrix. Its aim is to improve the UV-reflection efficiency of the composition.

However, there is still a need in the art for providing a material with an improved ability to efficiently reflect light and especially UV light.

SUMMARY OF THE INVENTION

It is an object of the present invention to overcome this problem, and to provide a reflective composition with further increased reflectivity, in particular for UV light.

According to a first aspect of the invention, a UV light reflective composition is provided, comprising a light transmissive matrix comprising a polysiloxane or a polysiloxane derivative, such as a silicone resin, and UV light reflective particles comprising boron nitride, said particles being dispersed in the transmissive matrix. Further the light reflective particle have an average particle size within the range of from 0.2 to 0.7 μm.

By the term "light reflective particle", is herein meant a particle which is capable of changing the direction of a light wave hitting its surface.

By the term "average particle size", refers to the standardized definition according to ASTM B330-12.

The particles may be generally spherical and may typically have a somewhat irregular morphology. However, the particles may have other geometrical shapes, including elongated. The particle size is typically measured in one direction through the particle, thus corresponding to the diameter of a particle that is generally spherical.

By the term "light transmissive", is herein meant the physical property of allowing light to pass through a material. A light transmissive material can either be a material which is transparent, i.e. allowing light to pass through the material without being scattered, or a material which is translucent, i.e. allowing light to pass through the material with scattering an interface of the material and its surroundings where there is a difference in index of refraction, or at grain boundaries within the material (in the case of a polycrystalline material).

An advantage of the composition according to the present invention is that the composition provides an increased reflectivity of light. For instance, it may reflect more than 90% of the incident light, in particular light of the UV and deep UV wavelength range (e.g. in the wavelength range of 200 to 420 nm, particularly in the range of 250 to 400 nm, even more particularly in the range of 250-310 nm). A further advantage of the composition is that it comprises boron nitride particles of a relatively small particle size. A small particle size is advantageous, since it may lead to an overall decreased weight content of boron nitride in the composition, which not only results in a more cost-effective and more environmentally friendly composition, but also a composition which may be easier to produce.

In an example, the reflective composition does not contain any binder that cures or hardens the composition. Hence, the composition does not require a curing step during production. Additionally, the composition may be soft or flexible.

According to an embodiment, the light reflective particles may have an average particle size of less than or equal to 0.6 μm. According to other embodiments, the light reflective particle may have an average particle size within the range of from 0.2 to 0.6 μm, such as an average particle size within the range of from 0.3 to 0.6 μm or for example an average particle size of about 0.5 μm.

According to an embodiment, the composition has a content of boron nitride of less than or equal to 30% by weight based on the weight of the light transmissive matrix. An advantage of the composition having a content of boron nitride of less or equal to 30% by weight, is that by retaining a low portion of boron nitride, a cheaper as well as more environmentally friendly composition can be achieved. It may further be easier to both manufacture and process the composition. A further advantage of the composition is that the reflectivity of the composition may be adjusted by adjusting the content of boron nitride within the light transmissive matrix.

According to an embodiment, the composition may have a content of boron nitride of less than or equal to 20% by weight based on the weight of the light transmissive matrix, such as a content of boron nitride of less than or equal to 15% by weight or for example a content of boron nitride of less than or equal to 10% by weight. According to an embodiment, the composition may have a content of boron nitride of less than or equal to 8% by weight, or for example a content of boron nitride within the range of from 1 to less than 9% by weight.

According to an embodiment, the composition further comprises light reflective particles comprising a reflective metal oxide. An advantage of including such additional light reflective particles, is that it may be possible to provide a more cost-efficient UV light reflective composition, while maintaining its high light reflectivity. In an example of this embodiment, the reflective metal oxide is aluminum oxide and/or yttrium oxide. By the term "metal oxide" is herein meant a compound, which comprises at least one metal atom and at least one oxygen atom, which typically is an anion having more electrons than protons, e.g. having an oxidation state of −2.

According to an embodiment, the transmissive matrix comprises a polysiloxane or a polysiloxane derivative, such as a silicone resin. By the term "silicone resin", is herein meant any type of silicone material which is formed by branched oligosiloxanes with a general formula of $R_nSiX_mO_y$, wherein R is a substituent such as Me or Ph, Si is silicon, X is a functional group such as H, OH, Cl or an alkoxy group, and O is oxygen.

In an example of this embodiment, the transmissive matrix comprises polydimethylsiloxane (PDMS).

According to a second aspect, the invention provides a UV light emitting arrangement comprising a light source for emitting UV light, and a reflective composition as described herein, arranged to receive and reflect light from the light source.

Due to the increased reflectivity of the reflective composition according to the first aspect of the invention comprised in the UV light emitting arrangement, and due to the possibility of redirecting the UV light emitted by the light source, a UV light emitting arrangement of increased efficiency is provided. The above-described advantage of the composition having a relative small particle size of the UV light reflective particle comprising boron nitride dispersed in the transmissive matrix, while being highly reflective, also applies. The overall decreased content of boron nitride may result in a more cost-effective and more environmentally friendly composition as well as a composition which may be easier to produce.

The terms "UV light" "UV emission" or "UV wavelength range" especially relates to light having a wavelength in the range of about 200 nm-420 nm. UV light may be subdivided into "UV-C light" that especially relates to light having a wavelength in the range of about 200 nm-280 nm, "UV-B light" that especially relates to light having a wavelength in the range of about 280 nm-315 nm and "UV-A light" that especially relates to light having a wavelength in the range of about 315 nm-420 nm.

According to an embodiment, the reflective composition may be contained, or enclosed, under an inert atmosphere. An advantage of keeping the composition under an inert atmosphere is that the functionality of the composition is better preserved when exposed to UV light, i.e. its reflective properties last longer over time.

Surprisingly, the present inventors also found that a when the reflective composition according was formed into a reflective layer by spin-coating, the functionality of the composition was better preserved when exposed to UV light. Hence, according to an embodiment of the invention, the reflective composition forms a spin coated layer. According to a third aspect, the invention provides a photo reactor comprising a reaction chamber, and a UV light emitting arrangement, according to embodiments of the second aspect of the invention, arranged to illuminate an interior space of the reaction chamber. Any advantages stated above relating to the UV light reflective composition and of the UV light emitting arrangement also apply to the photo reactor. In particular, a photo reactor according to the invention may provide higher efficiency and/or may be produced at lower cost and/or less environmental impact compared to conventional photo reactors.

According to a fourth aspect, the invention provides a method of forming a reflective layer, comprising the steps of providing a reflective composition according to the invention, and spin coating the composition onto a surface.

According to a fifth aspect, the invention provides a method of manufacturing a UV light emitting arrangement, comprising the steps of applying a composition, according to the invention, onto a surface to form a reflective layer, and arranging a UV light source to emit light in the direction of the reflective layer.

In an embodiment, the reflective composition is applied by spin-coating.

In an embodiment, the method further comprises the step of encapsulating the reflective layer under an inert atmosphere.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

Figure 1:
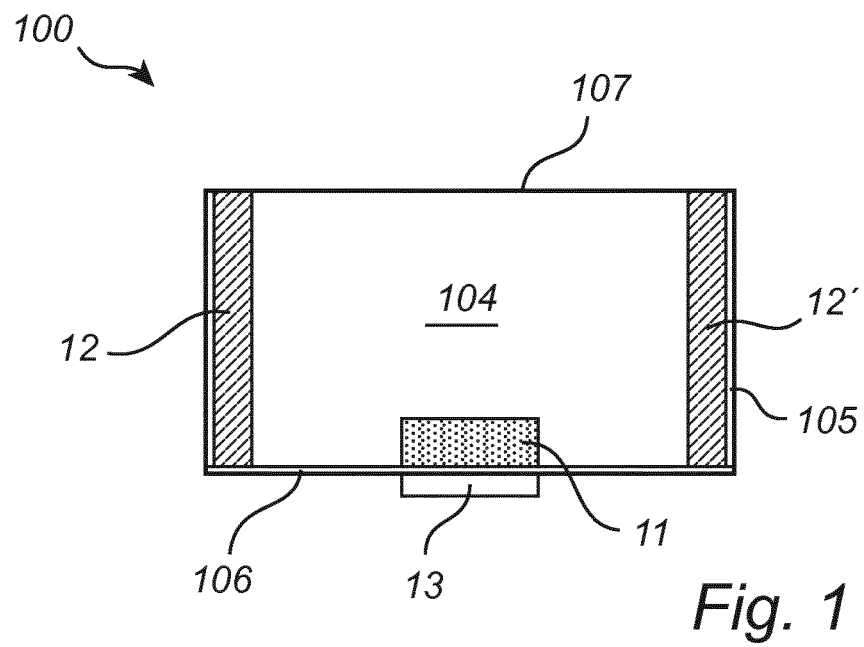
FIG. 1 shows a cross-sectional side view of a light emitting arrangement comprising a reflective composition according to embodiments of the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The present inventors have found that the reflectivity of a composition for use in light emitting arrangements e.g. UV lamps and/or photo reactors can be increased by dispersing boron nitride particles in a light transmissive matrix.

The composition according to the invention thus comprises a light transmissive matrix comprising a silicon resin, and light reflective particles comprising boron nitride dispersed in the transmissive matrix.

Advantageously, the composition can be highly reflective, reflecting more than 90% of the incident light within the wavelength range of from 200 to 700 nm, and especially in the range of from 200 to 420 nm, and particularly in the range of from 250 to 310 nm. The light reflective particles may have an average particle size within the range of from 0.2 to 0.7 µm, for example of from 0.3 to 0.7 µm or from 0.4 to 0.7 µm. In some embodiments, the light reflective particles may have an average particle size within the range of from 0.2 to 0.6 μm, such as from 0.3 to 0.6 μm, or 0.4 to 0.6 μm. In some embodiments, light reflective particles may have an average particle size less than or equal to 0.6 μm.

A transmissive matrix according to embodiments of the invention may be a matrix based on siloxane or derivatives of siloxane. The matrix may comprise polysiloxane or derivatives of polysiloxane, such as polydimethylsiloxanes. By the term "silicone resin", is herein meant any type of silicone material which is formed by branched oligosiloxanes with a general formula of $R_nSiX_mO_y$, wherein R is a substituent such as Me or Ph, Si is silicon, X is a functional group such as H, OH, Cl or an alkoxy group, and O is oxygen.

In some examples, the composition does not contain any binder or cross-linking additive. The composition may be uncured.

The composition may have a content of boron nitride of less than or equal to 30% by weight, for example of less than or equal to 25% by weight, or less than or equal to 20% by weight. In some embodiments, the composition may have a content of boron nitride of less than or equal to 15% by weight, such as of less than or equal to 10% by weight or less or equal than to 8% by weight. In some embodiments, the composition may have a content of boron nitride within the range of from 1 to 8% by weight.

In embodiments of the invention, the reflective composition may further comprise reflective particles comprising metal oxide. Examples of metal oxide particles that may be used in the composition, in addition to the particles comprising boron nitride, include aluminum oxide and yttrium oxide. The particles comprising boron nitride and any further particles comprising metal oxide may be present in the reflective composition at any desired weight ratios relative to each other. The composition according to embodiments of the invention may be used in a light emitting arrangement, especially a UV light emitting arrangement. The composition is typically applied onto a surface on the inside of the light emitting arrangement, in order to reflect light emitted by a light source, such as a UV LED. The composition, and especially a coating or layer formed thereof, may be used to direct the light emitted by the light source in a desired output direction and/or to prevent UV light from reaching a user or operator of the light emitting arrangement. The composition may further be used to direct the emitted light in order to increase the precision and efficiency of the performance of the light emitting arrangement.

FIG. 1 shows a cross-sectional view of a light emitting arrangement 100, comprising at least one light source 11, here a light emitting diode (LED), arranged on a bottom portion 106 of a light reflective chamber 104. The light reflective chamber 104 is further defined by at least one side wall 105, which may be a circular side wall. An inner surface of the side wall is at least partly covered with the composition according to the invention comprising the light reflective particles 12, 12'. Hence, the reflective composition forms a reflective layer or coating on the side wall. "Inner surface" here means a surface facing the interior of the chamber and the at least one light source. Alternatively, in some embodiments of the invention, the side wall is light transmissive and the composition 12, 12' may, instead of the inner wall, cover an outer surface of the side wall of the light reflective chamber 104. Optionally only a portion of the side wall may be covered with the composition.

During operation, light emitted from the light source 11 in the direction of the side wall 105 will be reflected by the reflective composition provided on the side wall 105 and/or bottom portion 106 of the light reflective chamber 104 and ultimately exit the light emitting chamber via a light exit window. In the illustrated embodiment, the light reflective chamber 104 comprises a top portion 107 comprising a light exit window which is light transmissive and through which light can exit from the light reflective chamber 104. In some embodiments, the light reflecting chamber may be an "open" light reflecting chamber, i.e. only comprising a bottom portion and at least one side wall, such that the light exit window is an open area defined by the side wall(s).

The bottom portion may likewise be at least partly covered by the composition comprising light reflective particles 12, 12'. Preferably, the side wall 105 and optionally also the bottom portion 106 of the light reflecting chamber 104 is highly reflective, thus ensuring good reflection of light, good light distribution and high efficiency due to light recycling and minimized absorption.

The LED, optionally arranged on a printed circuit board 13, may be placed on any wall within the light reflective chamber.

It is envisaged that the reflecting chamber may have any suitable geometrical shape. For example, instead of a circular wall surrounding the light reflecting chamber 104, the light emitting arrangement 100 may comprise one or more side walls defining e.g. a square, rectangular or other polygonal chamber.

The UV light source according to embodiments of the invention may be adapted e.g. for UV disinfection or sterilization, and may be utilized in a photo reactor and/or UV sterilizing equipment. The composition may be applied, in addition to the surface on the inside and/or on the outside of the UV light source, to a surface on the outside of the photo reactor, in order to reflect and further direct the light emitted by the light source to increase efficiency and/or prevent a user from being exposed to the light.

Figure 2:
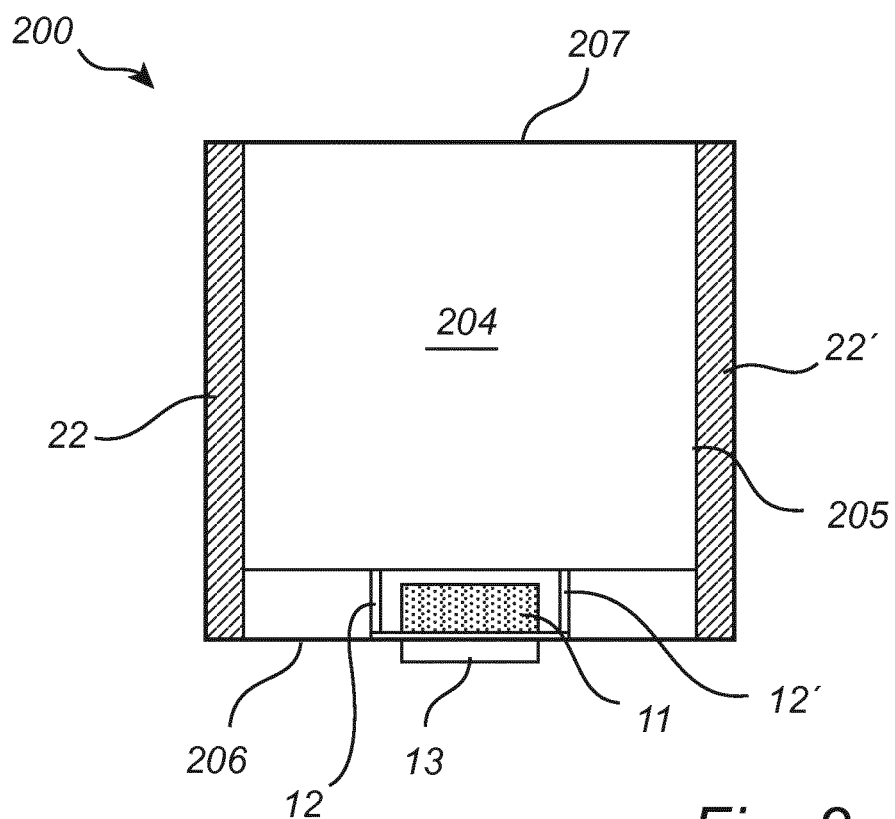
FIG. 2 shows a cross-sectional side view of a photo reactor comprising a reaction chamber and a light emitting arrangement comprising a reflective composition according to embodiments of the invention.

FIG. 2 shows a cross-sectional view of a photo reactor 200 comprising a reaction chamber 204, defined by a bottom portion 206 and at least one side wall 205. The photo reactor further comprises at least one light emitting arrangement or light source (typically a UV light emitting arrangement or UV light source) as described above, comprising light reflective chamber 104 comprising at least one light source 11, here a UV emitting LED. In the embodiment shown in this figure, the light reflective chamber is embedded within the bottom portion 206 of the reaction chamber 204 with the top portion 207 comprising a light exit window facing the reaction chamber 204 and which is at least partially transmissive to the light emitted by the light source, so that light can be emitted into the reaction chamber 204. Alternatively, the light reflective chamber 104 may be embedded at any position within the side wall 205 of the reaction chamber 204. The light source 11 is arranged at the bottom portion 106 of the light reflective chamber 104 on a printed circuit board 13. The inner surface of the side wall of the light reflective chamber 104 may be covered with the composition comprising the light reflective particles, according to the invention, or instead of the inner surface, the outer surface of the side wall, which may in some embodiments be light transmissive, may be covered with the composition comprising the light reflective particles.

The reaction chamber 204 of the photo reactor comprises at least one side wall 205 which in this embodiment is coated on its outer surface with a reflective composition 22, 22' comprising light reflective particles. However, in other embodiments the reflective composition may be applied on an inner surface of the side wall (i.e. on a surface facing the light source). In embodiments where the reflective composition is applied on an outer surface of the reaction chamber, the wall of the reaction chamber typically is at least partially transparent or translucent. In an embodiment, the reaction chamber 204 may made of quartz, although other suitable materials known to the person skilled in the art are also contemplated.

The reaction chamber forms a closed system. In operation, the reaction chamber 204 of the photo reactor 200 may be filled with an object or a fluid, such as water, intended to be disinfected. Once introduced into the reaction chamber 204, the object or fluid is exposed to light, typically UV light, generated by the light source. UV irradiation may cause degradation of organic and inorganic chemicals as well as degradation of the DNA of microorganisms such as bacteria, fungi and viruses. After exposure, the object or fluid can be removed from the reaction chamber. It may also be possible to purify contaminated air or any other type of gas, by filling the reaction chamber 204 with the contaminated air or gas.

To facilitate introduction of a fluid into the reaction chamber, and/or removal therefrom, the photo reactor may contain a fluid inlet for introduction of fluid into the reaction chamber, and/or a fluid outlet for removal of fluid from the reaction chamber. The fluid inlet and the fluid outlet may be connectable to e.g. a water pipeline system.

The reflective composition may be applied on a surface e.g. of a UV light source or a photo reactor as described above by any conventional coating method known to the skilled person, for example by spin coating, screen coating or dip coating. The composition may be formed into a layer having any desired thickness, however in some embodiments, the composition may be formed into a layer having a thickness of at least 1 mm, for example a thickness in the range of from 1 to 3 mm, e.g. from 1.5 to 2 mm.

EXAMPLES

The inventors investigated the reflectance of a composition according to the invention and of various comparative compositions.

The light source used in the tests was a UV-C LED configured to emit UV-light in the range of from 260 to 320 nm. The reflectance was recorded with a Perkin Elmer Lambda 950 UV-Vis spectrometer. Reflectance curves we relative to the reference (LabSphere certified reflectance) were recalculated to represent absolute reflectance. The reflective compositions tested were PDMS based compositions comprising boron nitride particles of different average particles sizes. The compositions were denoted as follows:

BN 205; average particle size of 0.5 µm (representing an embodiment of the invention BN110; average particle size of 3 µm (comparative composition)

BN400; average particle size of 5 µm (comparative composition)

BN641; average particle size of 7-15 µm (comparative composition)

The compositions were prepared by dispersing boron nitride particles within a PDMS matrix. The compositions were applied to a surface by conventional surface coating techniques (see below).

Figure 3:
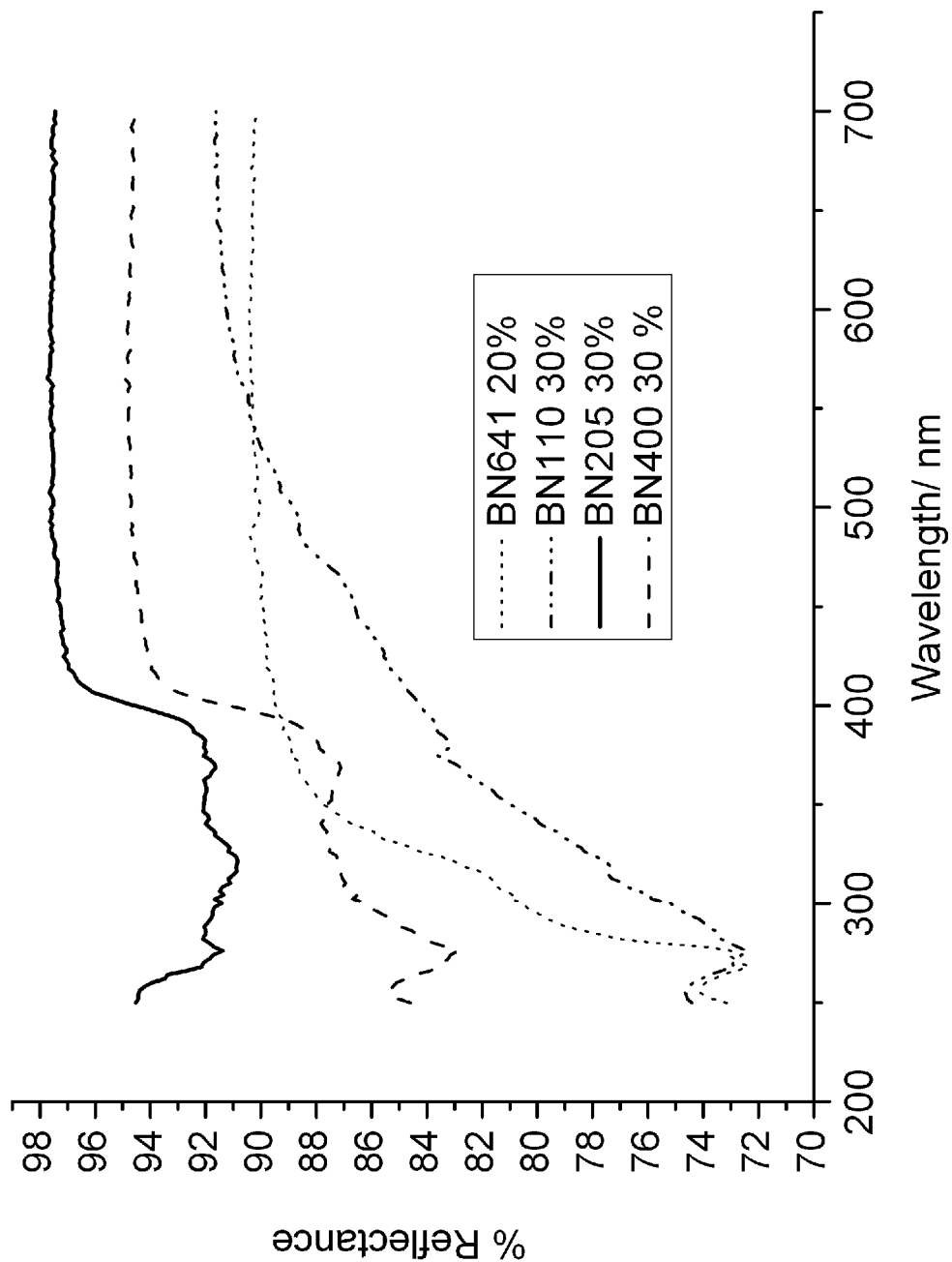
FIG. 3 is a graph showing the reflectance of various compositions comprising boron nitride particles dispersed in a polydimethylsiloxane matrix.

FIG. 3 is a graph illustrating the reflectance of the four compositions BN 205 (invention), BN110 (comparative), BN400 (comparative), and BN641 (comparative), comprising boron nitride (BN) dispersed in a polydimethylsiloxane matrix. The test also included a composition comprising conventional aluminum oxide particles and a standard. In this example, BN 110, BN 205 and BN 400 contained boron nitride at a content of 30% by weight respectively. BN 641 contained boron nitride at a content of 20% by weight.

As can be seen in FIG. 3, BN 205 shows a high reflectance of light in the wavelength range of from 250 to 700 nm. Within the wavelength range of from 250 to 700 nm, BN 205 reflected more than 90% of the light. Within the wavelength range of from 250 to 400 nm, BN 205 reflected more than 91% of the light. Within the wavelength range of from about 415 to 700 nm, BN 205 reflected more than 97% of the light.

The comparative composition comprising only aluminum oxide reflective particles had a reflectance of less than 90% with respect to light of the wavelength range of from 250 to 700.

Hence, a composition according to embodiments of the invention shows a markedly higher reflectance in the wavelength range of from 250 up to 400 nm, compared to BN 110, BN 400 and BN 641, which yield a reflectance of less than 90% within this wavelength range.

Figure 4:
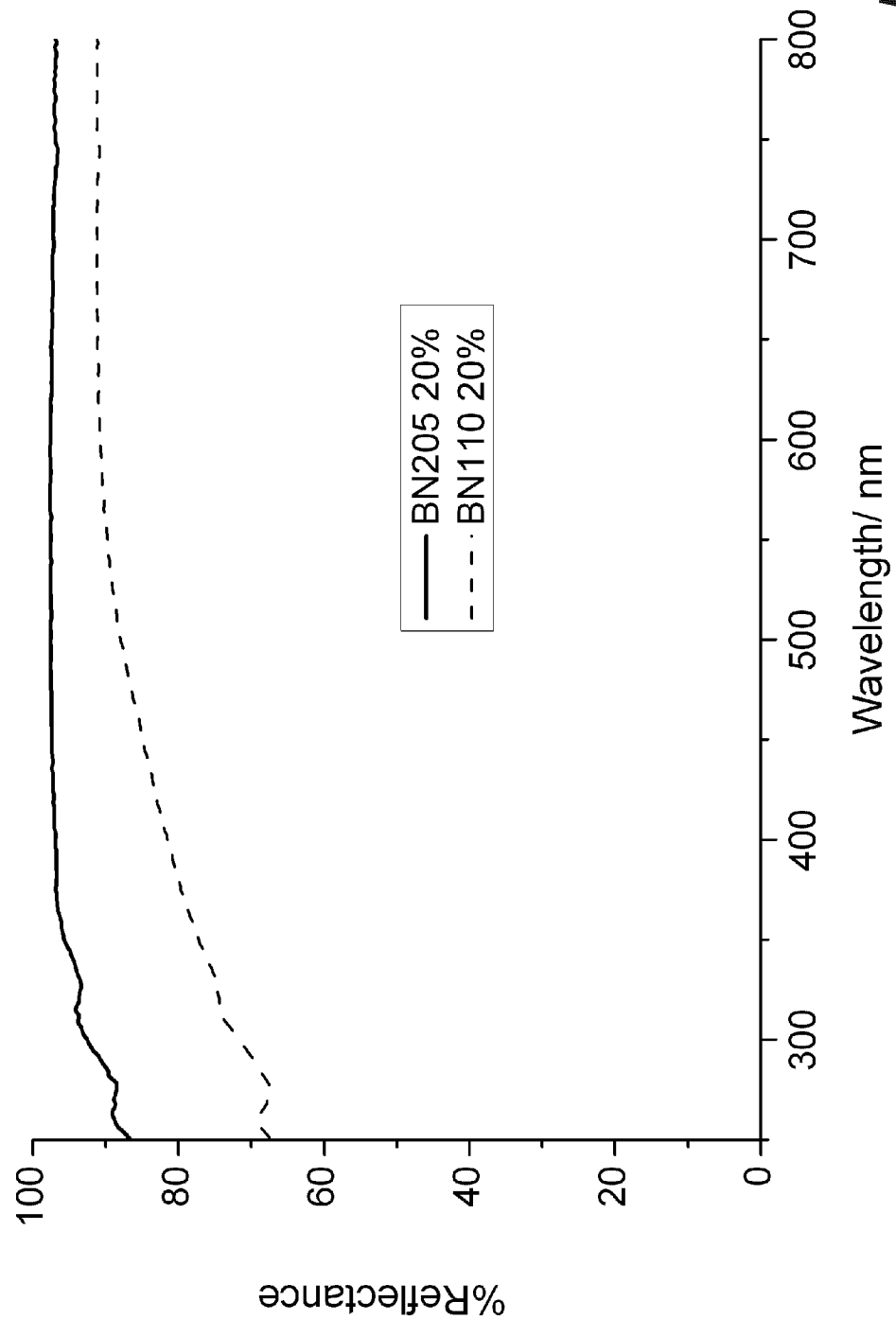
FIG. 4 is a graph showing the reflectance of two compositions having a content of 20% by weight of boron nitride particles dispersed in a polydimethylsiloxane matrix.

FIG. 4 shows a graph illustrating the respective reflectance values of the composition BN 205 and the comparative composition BN 110. BN 110 and BN 205 both comprise boron nitride at a content of 20% by weight; however the compositions have different average particle sizes. As illustrated in FIG. 4, the inventive composition BN 205 shows a reflectance of light within the wavelength range of from about 300 to 800 nm of over 90% and up to about 99%. BN 110 shows a lower reflectance than of BN 205. Only at wavelengths of about 550 nm and above, BN 110 shows a reflectance of higher than 90%.

Figure 5:
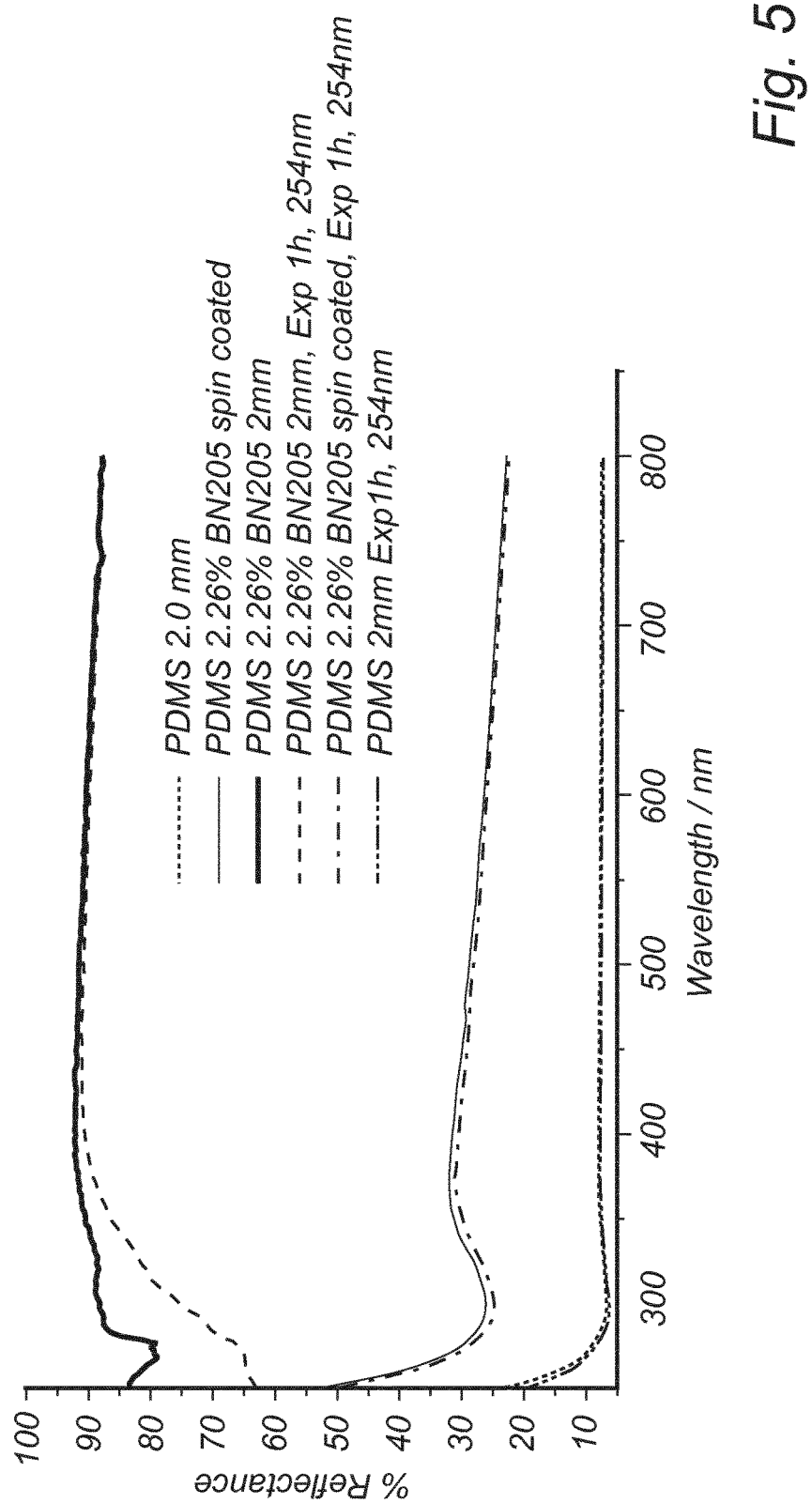
FIG. 5 is a graph showing the reflectance of modified compositions before and after 1 h exposure to UV light.

FIG. 5 shows a graph illustrating the influence that 1 h exposure to light having a wavelength of 254 nm has on the reflectance of various samples of BN 205 compositions comprising boron nitride at a content of 2.26% by weight. Also PDMS compositions without reflective particles were included for comparison. All samples of the were applied to form a 2 mm thick layer by drop casting, and the air bubbles were allowed to leave the film prior to thermal curing, except for two samples that were spin coated. The reflectivities of the samples were measured before and after exposure to light of wavelength 254 nm for 1 hour. At short wavelengths of about 250 to 420, the UV exposed drop cast (2 mm) BN 205 composition showed a lower reflectance compared to the non-exposed drop-cast BN 205 sample, indicating that a change in the reflective property occurred due to UV exposure. The spin coated sample of the BN 205 composition however did not show a similar change in the reflectance due to UV exposure, possibly because of the lower absorption by the thinner spin coated layer. As may be seen from FIG. 5, the spin coated sample BN205 shows a lower reflectance due to its smaller thickness and therefore higher light transmission. At higher light transmission less photons are absorbed by the matrix, and consequently less photo-oxidation reactions occur, which are believed to be responsible for photo-darkening of the polymer. PDMS itself starts to absorb below 350 nm, with two peaks at ~265 and 220 nm, respectively. In order to avoid or reduce photo-darkening; the reflective composition may be kept, e.g. encapsulated, under an inert atmosphere, such as a non-reactive gas atmosphere, e.g. composed of nitrogen, carbon dioxide, or helium. The non-reactive gas may enclose the composition in e.g. the UV light source and/or the photo reactor.

The person skilled in the art realizes that the present invention by no means is limited to the preferred embodiments described above. On the contrary, many modifications and variations are possible within the scope of the appended claims. For example, the reflective composition may be adjusted e.g. with respect to the concentration of particles in the matrix or the layer thickness of the reflective composition in a UV light source or a photo reactor. It may further be possible to use different spin coating techniques and encapsulation techniques in order to minimize the drop in reflectance of the composition within the UV light source or photo reactor. Various configurations may be used of e.g. where the reflective composition is applied relative the light source within the UV light source or photo reactor. Different amounts of respectively boron nitride and metal oxide may be used forming different mixtures in order to optimize the reflectivity versus cost of the reflective material.

Furthermore, although the light emitting arrangement and the photo reactor described herein is illustrated using a light emitting diode as light source, it is envisaged that also other types of light sources, in particular UV light sources are possible, including other solid-state light sources such as laser diodes, or conventional UV light sources.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A UV light reflective composition, comprising:
a light transmissive matrix comprising a polysiloxane or a polysiloxane derivative; and
deep UV light reflective particles comprising boron nitride, said particles being dispersed in the light transmissive matrix,
wherein the light reflective particles have an average particle size within the range of from 0.2 to 0.7 µm,
wherein the UV light reflective composition reflects at least 90% of incident light within the wavelength range of 200 to 700 nm.

2. The composition according to claim 1, wherein the light reflective particles have an average particle size of less than or equal to 0.6 µm.

3. The composition according to claim 1, wherein the composition has a content of boron nitride of less than or equal to 30% by weight.

4. The composition according to claim 1, wherein the composition has a content of boron nitride of less than or equal to 20% by weight.

5. The composition according to claim 1, wherein the composition has a content of boron nitride of less than or equal to 8% by weight.

6. The composition according to claim 1, wherein the composition has a content of boron nitride within the range of 1 to less than 9% by weight.

7. The composition according to claim 1, wherein the composition further comprises other light reflective particles comprising a reflective metal oxide.

8. The composition according to claim 7, wherein the reflective metal oxide is aluminum oxide and/or yttrium oxide.

9. The composition according to claim 1, wherein the transmissive matrix comprises a silicone resin.

10. The composition according to claim 1, wherein the light reflective particles have an average particle size equal to 0.5 µm and wherein the composition has a content of boron nitride of 30% by weight.

11. A UV light emitting arrangement, comprising:
a light source adapted to emit UV light; and
the composition according to claim 1, arranged to receive and reflect light from the light source.

12. The UV light emitting arrangement according to claim 11, wherein the composition is contained under an inert atmosphere.

13. The UV light emitting arrangement according to claim 11, wherein the light source is configured to emit UV light within the range from 250-310 nm.

14. The UV light emitting arrangement according to claim 13, wherein the light reflective particles have an average particle size of less than or equal to 0.6 µm.

15. The UV light emitting arrangement according to claim 14, wherein the composition has a content of boron nitride of less than or equal to 30% by weight.

16. The UV light emitting arrangement according to claim 11, wherein the light reflective particles have an average particle size equal to 0.5 µm and wherein the composition has a content of boron nitride of 30% by weight.

17. A photo reactor, comprising:
a reaction chamber; and
the UV light emitting arrangement according to claim 11, arranged to illuminate an interior space of the reaction chamber.

18. A method of manufacturing a UV light emitting arrangement, comprising the steps of:
applying the composition according to claim 1 onto a surface to form a reflective layer; and
arranging a UV light source to emit light in the direction of the reflective layer.

19. The method according to claim 18, wherein said composition is applied by spin-coating.

20. The method according to claim 18, comprising the step of encapsulating the reflective layer under an inert atmosphere.

* * * * *